US010472567B2

(12) United States Patent
Chen et al.

(10) Patent No.: US 10,472,567 B2
(45) Date of Patent: Nov. 12, 2019

(54) COMPOSITIONS AND METHODS FOR SELECTIVELY ETCHING TITANIUM NITRIDE

(71) Applicant: Entegris, Inc., Billerica, MA (US)

(72) Inventors: Li-Min Chen, Norwalk, CT (US); Emanuel I. Cooper, Scarsdale, NY (US); Steven Lippy, Brookfield, CT (US); Lingyan Song, Danbury, CT (US); Chia-Jung Hsu, Hsin-chu (TW); Sheng-Hung Tu, Hsin-chu (TW); Chieh Ju Wang, Hsin-chu (TW)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 14/772,652

(22) PCT Filed: Mar. 4, 2014

(86) PCT No.: PCT/US2014/020312
§ 371 (c)(1),
(2) Date: Sep. 3, 2015

(87) PCT Pub. No.: WO2014/138064
PCT Pub. Date: Sep. 12, 2014

(65) Prior Publication Data
US 2016/0032186 A1 Feb. 4, 2016

Related U.S. Application Data

(60) Provisional application No. 61/772,251, filed on Mar. 4, 2013.

(51) Int. Cl.
C09K 13/00 (2006.01)
H01L 21/3213 (2006.01)
C23F 1/14 (2006.01)
C23F 1/26 (2006.01)
C23G 1/02 (2006.01)
C09K 13/08 (2006.01)
C09K 13/10 (2006.01)
G03F 7/42 (2006.01)

(52) U.S. Cl.
CPC .............. C09K 13/00 (2013.01); C09K 13/08 (2013.01); C09K 13/10 (2013.01); C23F 1/14 (2013.01); C23F 1/26 (2013.01); C23G 1/02 (2013.01); G03F 7/423 (2013.01); H01L 21/32134 (2013.01)

(58) Field of Classification Search
None
See application file for complete search history.

(56) References Cited

U.S. PATENT DOCUMENTS

| 5,320,709 | A  | 6/1994  | Bowden           |
|-----------|----|---------|------------------|
| 5,702,075 | A  | 12/1997 | Lehrman          |
| 5,976,928 | A  | 11/1999 | Buskirk et al.   |
| 5,993,685 | A  | 11/1999 | Currie et al.    |
| 6,194,366 | B1 | 2/2001  | Naghshineh et al.|
| 6,211,126 | B1 | 4/2001  | Wojtczak et al.  |
| 6,224,785 | B1 | 5/2001  | Wojtczak et al.  |
| 6,280,651 | B1 | 8/2001  | Wojtczak et al.  |
| 6,306,807 | B1 | 10/2001 | Wojtczak et al.  |
| 6,322,600 | B1 | 11/2001 | Brewer et al.    |
| 6,323,168 | B1 | 11/2001 | Kloffenstein et al. |
| 6,344,432 | B1 | 2/2002  | Wojtczak et al.  |
| 6,346,741 | B1 | 2/2002  | Van Buskirk et al.|
| 6,395,194 | B1 | 5/2002  | Russell et al.   |
| 6,409,781 | B1 | 6/2002  | Wojtczak et al.  |
| 6,492,308 | B1 | 12/2002 | Naghshineh et al.|
| 6,527,819 | B2 | 3/2003  | Wojtczak et al.  |
| 6,566,315 | B2 | 5/2003  | Wojtczak et al.  |
| 6,627,587 | B2 | 9/2003  | Naghshineh et al.|
| 6,698,619 | B2 | 3/2004  | Wertenberger     |
| 6,723,691 | B2 | 4/2004  | Naghshineh et al.|
| 6,735,978 | B1 | 5/2004  | Tom et al.       |
| 6,755,989 | B2 | 6/2004  | Wojtczak et al.  |
| 6,773,873 | B2 | 8/2004  | Seijo et al.     |
| 6,800,218 | B2 | 10/2004 | Ma et al.        |
| 6,802,983 | B2 | 10/2004 | Mullee et al.    |
| 6,849,200 | B2 | 2/2005  | Baum et al.      |
| 6,875,733 | B1 | 4/2005  | Wojtczak         |
| 6,896,826 | B2 | 5/2005  | Wojtczak et al.  |
| 6,943,139 | B2 | 9/2005  | Korzenski et al. |
| 6,989,358 | B2 | 1/2006  | Korzenski et al. |
| 7,011,716 | B2 | 3/2006  | Xu et al.        |
| 7,029,373 | B2 | 4/2006  | Ma et al.        |
| 7,030,168 | B2 | 4/2006  | Xu et al.        |

(Continued)

FOREIGN PATENT DOCUMENTS

CN   1505106 A    6/2004
JP   2011159658 A 8/2011

(Continued)

OTHER PUBLICATIONS

International Search Report, dated Jun. 26, 2014.

Primary Examiner — Jiong-Ping Lu
(74) Attorney, Agent, or Firm — Entegris, Inc.

(57) ABSTRACT

Semi-aqueous compositions useful for the selective removal of titanium nitride and/or photoresist etch residue materials relative to metal conducting, e.g., tungsten and copper, and insulating materials from a microelectronic device having same thereon. The semi-aqueous compositions contain at least one oxidant, at least one etchant, and at least one organic solvent, may contain various corrosion inhibitors to ensure selectivity.

14 Claims, No Drawings

(56) References Cited

U.S. PATENT DOCUMENTS

| | | | |
|---|---|---|---|
| 7,119,052 B2 | 10/2006 | Korzenski et al. | |
| 7,119,418 B2 | 10/2006 | Xu et al. | |
| 7,160,815 B2 | 1/2007 | Korzenski et al. | |
| 7,188,644 B2 | 3/2007 | Kelly et al. | |
| 7,223,352 B2 | 5/2007 | Korzenski et al. | |
| 7,300,601 B2 | 11/2007 | Liu et al. | |
| 7,326,673 B2 | 2/2008 | Xu et al. | |
| 7,335,239 B2 | 2/2008 | Baum | |
| 7,361,603 B2* | 4/2008 | Liu | C09G 1/02 257/E21.304 |
| 7,365,045 B2 | 4/2008 | Walker et al. | |
| 7,485,611 B2 | 2/2009 | Roeder et al. | |
| 7,534,752 B2 | 5/2009 | Wojtczak et al. | |
| 7,553,803 B2 | 6/2009 | Korzenski et al. | |
| 7,557,073 B2 | 7/2009 | Korzenski et al. | |
| 7,736,405 B2 | 6/2010 | Darsillo et al. | |
| 7,888,301 B2 | 2/2011 | Bernhard et al. | |
| 7,922,824 B2 | 4/2011 | Minsek et al. | |
| 7,923,423 B2 | 4/2011 | Walker et al. | |
| 7,960,328 B2 | 6/2011 | Visintin et al. | |
| 7,968,506 B2 | 6/2011 | Chou et al. | |
| 8,026,200 B2 | 9/2011 | Cooper et al. | |
| 8,058,219 B2 | 11/2011 | Rath et al. | |
| 8,114,220 B2 | 2/2012 | Visintin et al. | |
| 8,178,585 B2 | 5/2012 | Petruska et al. | |
| 8,236,485 B2 | 8/2012 | Minsek et al. | |
| 8,304,344 B2 | 11/2012 | Boggs et al. | |
| 8,338,087 B2 | 12/2012 | Rath et al. | |
| 8,367,555 B2 | 2/2013 | Afzali-Ardakani et al. | |
| 8,618,036 B2 | 12/2013 | Afzali-Ardakani et al. | |
| 8,685,909 B2 | 4/2014 | Angst et al. | |
| 8,754,021 B2 | 6/2014 | Barnes et al. | |
| 8,778,210 B2 | 7/2014 | Cooper et al. | |
| 8,951,948 B2 | 2/2015 | Rath et al. | |
| 9,045,717 B2 | 6/2015 | Nakanishi et al. | |
| 9,063,431 B2 | 6/2015 | Barnes et al. | |
| 9,074,169 B2 | 7/2015 | Chen et al. | |
| 9,074,170 B2 | 7/2015 | Barnes et al. | |
| 9,175,404 B2 | 11/2015 | Kojima et al. | |
| 9,215,813 B2 | 12/2015 | Brosseau et al. | |
| 2003/0102457 A1* | 6/2003 | Miller | C09G 1/02 252/79.1 |
| 2005/0118832 A1 | 6/2005 | Korzenski et al. | |
| 2005/0145311 A1 | 7/2005 | Walker et al. | |
| 2005/0227482 A1 | 10/2005 | Korzenski et al. | |
| 2005/0263490 A1 | 12/2005 | Liu et al. | |
| 2006/0019850 A1 | 1/2006 | Korzenski et al. | |
| 2006/0063687 A1 | 3/2006 | Minsek et al. | |
| 2006/0148666 A1 | 7/2006 | Peters et al. | |
| 2006/0154186 A1 | 7/2006 | Minsek et al. | |
| 2006/0249482 A1 | 11/2006 | Wrschka et al. | |
| 2007/0235684 A1* | 10/2007 | Mistkawi | C09K 13/08 252/79.1 |
| 2007/0251551 A1 | 11/2007 | Korzenski et al. | |
| 2008/0076688 A1 | 3/2008 | Barnes et al. | |
| 2008/0125342 A1 | 5/2008 | Visintin et al. | |
| 2008/0271991 A1 | 11/2008 | Korzenski et al. | |
| 2009/0032766 A1 | 2/2009 | Rajaratnam et al. | |
| 2009/0082240 A1 | 3/2009 | Nukui et al. | |
| 2009/0192065 A1 | 7/2009 | Korzenski et al. | |
| 2009/0212021 A1 | 8/2009 | Bernhard et al. | |
| 2009/0215269 A1 | 8/2009 | Boggs et al. | |
| 2009/0253072 A1 | 10/2009 | Petruska et al. | |
| 2009/0301996 A1 | 12/2009 | Visintin et al. | |
| 2010/0056410 A1 | 3/2010 | Visintin et al. | |
| 2010/0065530 A1* | 3/2010 | Walker | H01L 21/32134 216/13 |
| 2010/0087065 A1 | 4/2010 | Boggs et al. | |
| 2010/0112728 A1 | 5/2010 | Korzenski et al. | |
| 2010/0163788 A1* | 7/2010 | Visintin | C11D 1/62 252/79.3 |
| 2010/0261632 A1 | 10/2010 | Korzenski et al. | |
| 2010/0286014 A1 | 11/2010 | Barnes | |
| 2011/0039747 A1 | 2/2011 | Zhou et al. | |
| 2011/0070735 A1* | 3/2011 | Shi | C09G 1/02 438/692 |
| 2011/0117751 A1 | 5/2011 | Sonthalia et al. | |
| 2013/0034923 A1 | 2/2013 | Kim et al. | |
| 2013/0045908 A1 | 2/2013 | Cui et al. | |
| 2013/0270217 A1 | 10/2013 | Yoshida et al. | |
| 2013/0276284 A1* | 10/2013 | Brosseau | C22B 7/007 29/426.1 |
| 2013/0280123 A1 | 10/2013 | Chen et al. | |
| 2013/0295712 A1 | 11/2013 | Chen et al. | |
| 2013/0303420 A1 | 11/2013 | Cooper et al. | |
| 2013/0336857 A1 | 12/2013 | Korzenski et al. | |
| 2014/0038420 A1 | 2/2014 | Chen et al. | |
| 2014/0191019 A1 | 7/2014 | Chen et al. | |
| 2014/0306162 A1 | 10/2014 | Poe et al. | |
| 2014/0318584 A1 | 10/2014 | Cooper et al. | |
| 2015/0027978 A1* | 1/2015 | Barnes | C09K 13/00 216/13 |
| 2015/0045277 A1 | 2/2015 | Liu et al. | |
| 2015/0050199 A1 | 2/2015 | Korzenski et al. | |
| 2015/0075570 A1 | 3/2015 | Wu et al. | |
| 2015/0114429 A1 | 4/2015 | Jenq et al. | |
| 2015/0162213 A1 | 6/2015 | Chen et al. | |
| 2015/0168843 A1 | 6/2015 | Cooper et al. | |
| 2015/0344825 A1 | 12/2015 | Cooper et al. | |

FOREIGN PATENT DOCUMENTS

| | | | |
|---|---|---|---|
| JP | 2012036750 A | 2/2012 | |
| JP | 2012062572 A | 3/2012 | |
| JP | 2012186470 A | 9/2012 | |
| JP | 2012251026 A | 12/2012 | |
| WO | 2006110645 A2 | 10/2006 | |
| WO | 2006127885 A1 | 11/2006 | |
| WO | 2007027522 A2 | 3/2007 | |
| WO | 2008036823 A2 | 3/2008 | |
| WO | 2008/141206 A3 | 11/2008 | |
| WO | 2008157345 A2 | 12/2008 | |
| WO | 2009073596 A2 | 6/2009 | |
| WO | 2010017160 A2 | 2/2010 | |
| WO | 2010039936 A2 | 4/2010 | |
| WO | 2010086745 A1 | 8/2010 | |
| WO | 2010091045 A2 | 8/2010 | |
| WO | 2012048079 A2 | 4/2012 | |
| WO | WO2012048079 * | 4/2012 | C23F 1/02 |
| WO | 2012154498 A2 | 11/2012 | |
| WO | 2012174518 A2 | 12/2012 | |
| WO | 2013058770 A1 | 4/2013 | |
| WO | 2013123317 A1 | 8/2013 | |
| WO | 2013138278 A1 | 9/2013 | |

* cited by examiner

COMPOSITIONS AND METHODS FOR SELECTIVELY ETCHING TITANIUM NITRIDE

CROSS-REFERENCE TO RELATED APPLICATIONS

This application is filed under the provisions of 35 U.S.C. § 371 and claims the priority of International Patent Application No. PCT/US2014/020312 filed on 4 Mar. 2014 entitled "COMPOSITIONS AND METHODS FOR SELECTIVELY ETCHING TITANIUM NITRIDE" in the name of Li-Min CHEN, et al., which claims priority to U.S. Provisional Patent Application No. 61/772,251 filed on 4 Mar. 2013, both of which are hereby incorporated by reference herein in their entirety.

FIELD

The present invention relates to a composition and process for selectively etching titanium nitride and/or photoresist etch residues in the presence of metal conductor and insulator materials (i.e., low-k dielectrics), and more particularly to a composition and process for effectively and efficiently etching titanium nitride and/or photoresist etch residues at an etch rate and selectivity that is higher than that of exposed or underlying layers of copper, tungsten, and low-k dielectric materials.

DESCRIPTION OF THE RELATED ART

Photoresist masks are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying metal conductor layer and low-k dielectric material. In other words, the removal chemistry is required to be highly selective to the metal conductor layer and low-k dielectric layer.

Accordingly, an object of the present invention to provide improved compositions for the selective removal of hard mask materials relative to metal conductor layers and low-k dielectric layers that are present, while not compromising the etch rate of the hard mask.

SUMMARY OF THE INVENTION

The present invention relates to a composition and process for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, tungsten, and low-k dielectric layers.

In one aspect, a composition for selectively removing titanium nitride and/or photoresist etch residue material from the surface of a microelectronic device having same thereon is described, said composition comprising at least one oxidizing agent, at least one etchant, at least one corrosion inhibitor, at least source of silica, water, and at least one organic solvent, wherein the composition is substantially devoid of hydrogen peroxide.

In another aspect, a method of etching titanium nitride material from a surface of a microelectronic device having same thereon is described, said method comprising contacting the surface with a composition comprising at least one oxidizing agent, at least one etchant, at least one corrosion inhibitor, at least source of silica, water, and at least one organic solvent, wherein the composition is substantially devoid of hydrogen peroxide, and wherein the composition selectively removes the titanium nitride material from the surface relative to metals and insulating materials.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to semi-aqueous compositions and processes for selectively etching hard mask layers and/or photoresist etch residues relative to metal conductor layers and low-k dielectric layers that are present. More specifically, the present invention relates to a semi-aqueous composition and process for selectively etching titanium nitride and/or photoresist etch residues relative to copper, tungsten, and low-k dielectric layers. Other materials that may be present on the microelectronic device, should not be substantially removed or corroded by said compositions.

For ease of reference, "microelectronic device" corresponds to semiconductor substrates, flat panel displays, phase change memory devices, solar panels and other products including solar cell devices, photovoltaics, and micro-electromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Hardmask capping layer" or "hardmask" as used herein corresponds to materials deposited over dielectric material to protect same during the plasma etch step. Hardmask capping layers are traditionally silicon nitrides, silicon oxynitrides, titanium nitride, titanium oxynitride, titanium and other similar compounds.

As used herein, "titanium nitride" and "$TiN_x$" correspond to pure titanium nitride as well as impure titanium nitride including varying stoichiometries, and oxygen content ($Ti-O_xN_y$)

As used herein, "about" is intended to correspond to ±5% of the stated value.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "metal conductor layers" comprise copper, tungsten, cobalt, molybdenum, aluminum, ruthenium, alloys comprising same, and combinations thereof.

As defined herein, "amine" species include at least one primary, secondary, and tertiary amines, with the proviso that (i) species including both a carboxylic acid group and an amine group, (ii) surfactants that include amine groups, and (iii) species where the amine group is a substituent (e.g., attached to an aryl or heterocyclic moiety) are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

As defined herein, "photoresist etch residues" corresponds to any residue comprising photoresist material, or material that is a by-product of photoresist subsequent to an etching or aching step, as readily understood by the person skilled in the art.

"Substantially devoid" is defined herein as less than 2 wt. %, preferably less than 1 wt. %, more preferably less than 0.5 wt. %, even more preferably less than 0.1 wt. %, and most preferably 0 wt. %.

As used herein, "fluoride" species correspond to species including an ionic fluoride ($F^-$) or covalently bonded fluorine. It is to be appreciated that the fluoride species may be included as a fluoride species or generated in situ.

As used herein, "chloride" species correspond to species including an ionic chloride ($Cl^-$), with the proviso that surfactants that include chloride anions are not considered "chlorides" according to this definition.

As used herein, the term "semi-aqueous" refers to a mixture of water and organic solvent components. The semi-aqueous removal compositions must not substantially damage the metal conductor layers and low-k dielectric layers that are present while the hard mask layers and/or photoresist etch residues are removed.

As defined herein, a strong base is any base having at least one pKa greater than 11, while a weak base is any base having at least one pKa less than 11.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Embodiments of the present invention include a chemistry for removing hard mask and/or photoresist etch residues. In one embodiment, the semi-aqueous composition is a wet-etch solution that removes a metal hard mask and/or photoresist etch residues on a dielectric layer and is highly selective relative to a metal conductor layer underneath the dielectric layer and the dielectric layer itself. In a more specific embodiment, the semi-aqueous composition is a wet-etch solution that removes a titanium nitride layer and/or photoresist etch residues that is highly selective relative to at least one of copper, tungsten, and low-k dielectric materials.

Accordingly, in one aspect, a semi-aqueous composition for selectively removing titanium nitride and/or photoresist etch residue material from the surface of a microelectronic device having same thereon is described, said composition including at least one oxidizing agent and at least one etchant, wherein the composition is substantially devoid of hydrogen peroxide. In one embodiment, the semi-aqueous composition for removing titanium nitride and/or photoresist etch residue material from the surface of a microelectronic device having same thereon comprises, consists of, or consists essentially of at least one oxidizing agent, at least one etchant, water, and at least one organic solvent, wherein the composition is substantially devoid of hydrogen peroxide. In another embodiment, the semi-aqueous composition for removing titanium nitride and/or photoresist etch residue material from the surface of a microelectronic device having same thereon comprises, consists of, or consists essentially of at least one oxidizing agent, at least one etchant, water, and at least one corrosion inhibitor, wherein the composition is substantially devoid of hydrogen peroxide. In still another embodiment, the semi-aqueous composition for removing titanium nitride and/or photoresist etch residue material from the surface of a microelectronic device having same thereon comprises, consists of, or consists essentially of at least one oxidizing agent, at least one etchant, water, at least one source of silica, and at least one corrosion inhibitor, wherein the composition is substantially devoid of hydrogen peroxide. In yet another embodiment, the semi-aqueous composition for removing titanium nitride and/or photoresist etch residue material from the surface of a microelectronic device having same thereon comprises, consists of, or consists essentially of at least one oxidizing agent, at least one etchant, at least one corrosion inhibitor, water, and at least one organic solvent, wherein the composition is substantially devoid of hydrogen peroxide. In still another embodiment, the semi-aqueous composition for removing titanium nitride and/or photoresist etch residue material from the surface of a microelectronic device having same thereon comprises, consists of, or consists essentially of at least one oxidizing agent, at least one etchant, at least one source of silica, water, and at least one organic solvent, wherein the composition is substantially devoid of hydrogen peroxide. In yet another embodiment, the semi-aqueous composition for removing titanium nitride and/or photoresist etch residue material from the surface of a microelectronic device having same thereon comprises, consists of, or consists essentially of at least one oxidizing agent, at least one etchant, at least one corrosion inhibitor, at least source of silica, water, and at least one organic solvent, wherein the composition is substantially devoid of hydrogen peroxide. Other components contemplated for inclusion in the semi-aqueous compositions described herein include, but are not limited to, at least one low-k passivating agent, at least one surfactant, at least one iodine scavenger, and combinations thereof. Advantageously, these compositions have a TiN to tungsten selectivity of greater than 40:1 and a tungsten removal rate less than about 1 Å min$^{-1}$, even more preferably a TiN to tungsten selectivity of greater than 50:1, and a tungsten removal rate less than about 1 Å min$^{-1}$ at temperatures in a range from about 45° C. to about 60° C. Furthermore, these compositions have a TiN to copper selectivity of greater than 20:1 and a copper removal rate less than about 2 Å min$^{-1}$, even more preferably a TiN to copper selectivity of greater than 30:1, and a copper removal rate less than about 2 Å min$^{-1}$ at temperatures in a range from about 45° C. to about 60° C. These compositions are substantially devoid of amines, as defined herein, chemical mechanical polishing abrasive materials, metal halides, and combinations thereof. The semi-aqueous compositions have pH value in a range from 0 to 4, and surface tension value in a range from 30 to 50 mN/m, preferably in a range from about 30 mN/m to about 40 mN/m.

Etchants are added to increase the etch rate of the titanium nitride. Etchants contemplated include, but are not limited to, HF, ammonium fluoride, tetrafluoroboric acid, hexafluorosilicic acid, other compounds containing B—F or Si—F bonds, tetrabutylammonium tetrafluoroborate (TBA-BF$_4$), tetraalkylammonium fluoride (NR$_1$R$_2$R$_3$R$_4$F), strong bases such as tetraalkylammonium hydroxide (NR$_1$R$_2$R$_3$R$_4$OH), where R$_1$, R$_2$, R$_3$, R$_4$ may be the same as or different from one another and is selected from the group consisting of hydrogen, straight-chained or branched C$_1$-C$_6$ alkyl groups (e.g., methyl, ethyl, propyl, butyl, pentyl, hexyl), C$_1$-C$_6$ alkoxy groups (e.g., hydroxyethyl, hydroxypropyl) substituted or unsubstituted aryl groups (e.g., benzyl), weak bases, and combinations thereof. Preferably, the fluoride source comprises tetrafluoroboric acid, hexafluorosilicic acid, H$_2$ZrF$_6$, H$_2$TiF$_6$, HPF$_6$, ammonium fluoride, ammonium bifluoride, tetramethylammonium fluoride, tetramethylammonium hydroxide, ammonium hexafluorosilicate, ammonium hexafluorotitanate, or a combination of ammonium fluoride and tetramethylammonium fluoride. Alternatively, or in addition to fluoride sources, the etchant can comprise a strong base such as tetramethylammonium hydroxide (TMAH), tetraethylammonium hydroxide (TEAH), tetrapropylammonium hydroxide (TPAH), tetrabutylammonium hydroxide (TBAH), benzyltrimethylammonium hydroxide (BTMAH), potassium hydroxide, ammonium hydroxide, benzyltriethylammonium hydroxide (BTEAH), tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, diethyldimethylammonium hydroxide (DEDMAH), 1,1,3,3-tetramethylguanidine (TMG), guanidine carbonate, arginine, and combinations thereof. Most preferably, the etchant comprises hexafluorosilicic acid, tetrafluoroboric acid, or combinations thereof.

Oxidizing agents are included to oxidize Ti$^{3+}$ in TiN$_x$. Oxidizing agents contemplated herein include, but are not limited to, hydrogen peroxide (H$_2$O$_2$), FeCl$_3$, FeF$_3$, Fe(NO$_3$)$_3$, Sr(NO$_3$)$_2$, CoF$_3$, MnF$_3$, oxone (2KHSO$_5$.KHSO$_4$.K$_2$SO$_4$), periodic acid, iodic acid, vanadium (V) oxide, vanadium (IV,V) oxide (V$_6$O$_{13}$), ammonium vanadate, ammonium polyatomic salts (e.g., ammonium peroxomonosulfate, ammonium chlorite (NH$_4$ClO$_2$), ammonium chlorate (NH$_4$ClO$_3$), ammonium iodate (NH$_4$IO$_3$), ammonium nitrate (NH$_4$NO$_3$), ammonium perborate (NH$_4$BO$_3$), ammonium perchlorate (NH$_4$ClO$_4$), ammonium periodate (NH$_4$IO$_4$), ammonium persulfate ((NH$_4$)$_2$S$_2$O$_8$), ammonium hypochlorite (NH$_4$ClO)), ammonium tungstate ((NH$_4$)$_{10}$H$_2$(W$_2$O$_7$)), sodium polyatomic salts (e.g., sodium persulfate (Na$_2$S$_2$O$_8$), sodium hypochlorite (NaClO), sodium perborate), potassium polyatomic salts (e.g., potassium iodate (KIO$_3$), potassium permanganate (KMnO$_4$), potassium persulfate, nitric acid (HNO$_3$), potassium persulfate (K$_2$S$_2$O$_8$), potassium hypochlorite (KClO)), tetramethylammonium polyatomic salts (e.g., tetramethylammonium chlorite ((N(CH$_3$)$_4$)ClO$_2$), tetramethylammonium chlorate ((N(CH$_3$)$_4$)ClO$_3$), tetramethylammonium iodate ((N(CH$_3$)$_4$)IO$_3$), tetramethylammonium perborate ((N(CH$_3$)$_4$)BO$_3$), tetramethylammonium perchlorate ((N(CH$_3$)$_4$)ClO$_4$), tetramethylammonium periodate ((N(CH$_3$)$_4$)IO$_4$), tetramethylammonium persulfate ((N(CH$_3$)$_4$)S$_2$O$_8$)), tetrabutylammonium polyatomic salts (e.g., tetrabutylammonium peroxomonosulfate), peroxomonosulfuric acid, ferric nitrate (Fe(NO$_3$)$_3$), urea hydrogen peroxide ((CO(NH$_2$)$_2$)H$_2$O$_2$), peracetic acid (CH$_3$(CO)OOH), 1,4-benzoquinone, toluquinone, dimethyl-1,4-benzoquinone, chloranil, alloxan, N-methylmorpholine N-oxide, trimethylamine N-oxide, and combinations thereof. When the oxidizing agent is a salt it can be hydrated or anhydrous. The oxidizing agent may be introduced to the composition at the manufacturer, prior to introduction of the composition to the device wafer, or alternatively at the device wafer, i.e., in situ. Preferably, the oxidizing agent for the composition of the second aspect comprises hydrogen peroxide. Preferably, the oxidizing agent for the semi-aqueous composition comprises vanadium oxide, ammonium vanadate, ammonium iodate, ammonium periodate, iodic acid, periodic acid, 1,4-benzoquinone, or combinations thereof.

The semi-aqueous compositions comprise at least one source of silica to reduce the activity of the etchant source. In one embodiment, the at least one source of silica comprises an alkoxysilane. Alkoxysilanes contemplated have the general formula SiR$^1$R$^2$R$^3$R$^4$, wherein the R$^1$, R$^2$, R$^3$ and R$^4$ are the same as or different from one another and are selected from the group consisting of straight-chained C$_1$-C$_6$ alkyl groups (e.g., methyl, ethyl, propyl, butyl, pentyl, hexyl), branched C$_1$-C$_6$ alkyl groups, C$_1$-C$_6$ alkoxy groups (e.g, methoxy, ethoxy, propoxy, butoxy, pentoxy, hexoxy), a phenyl group, and a combination thereof. It should be appreciated by the skilled artisan, that to be characterized as an alkoxysilane, at least one of R$^1$, R$^2$, R$^3$ or R$^4$ must be a C$_1$-C$_6$ alkoxy group. Alkoxysilanes contemplated include methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, and combinations thereof. Other sources of silica that can be used instead or in addition to the alkoxysilanes include ammonium hexafluorosilicate, sodium silicate, tetramethyl ammonium silicate (TMAS), and combinations thereof. Preferably, the silicon-containing compound comprises TEOS, TMAS, sodium silicate, or combinations thereof.

An alternative to the inclusion of both the etchant and the source of silica is the generation of fluorosilicic acid in situ. Hydrofluoric acid (preferably at concentrations of 40% or higher) and TEOS or other hydrolyzable alkoxysilane may be combined in the appropriate ratio in the at least one organic solvent to form a concentrate having the correct amount of fluorosilicic acid saturated or nearly saturated in SiO$_2$.

When the oxidizing agent comprises iodate or periodate, an iodine scavenger may optionally be added to the semi-aqueous composition. Although not wishing to be bound by theory, it is thought that as the iodate or periodate are reduced, iodine accumulates, which increases the rate of copper etch. Iodine scavengers include, but are not limited to, ketones more preferably ketones with hydrogen(s) alpha to the carbonyl such as 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, and combinations thereof. Preferably, the iodine scavenger includes 4-methyl-2-pentanone, 2,4-dimethyl-3-pentanone, or cyclohexanone.

Metal corrosion inhibitors are added to block the oxidative activity of the oxidizing agent(s). Metal corrosion inhibitors contemplated herein include, but are not limited to, 5-amino-1,3,4-thiadiazole-2-thiol (ATDT), benzotriazole (BTA), 1,2,4-triazole (TAZ), tolyltriazole, 5-methyl-benzotriazole, 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-aminotetrazole, pentylenetetrazole, 5-phenyl-1H-tetrazole, 5-benzyl-1H-tetrazole, Ablumine O (Taiwan Surfactant), 2-benzylpyridine, succinimide, maleimide, phthalimide, glutarimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, benzothiazole, imidazole, pyrazole, indiazole, adenosine, carbazole, saccharin, and benzoin oxime. Additional corrosion inhibitors include cationic quaternary surfactant salts such as benzalkonium chloride, benzyldimethyldodecylammonium chloride, myristyltrimethylammonium bromide, dodecyltrimethylammonium bromide, hexadecylpyridinium chloride, Aliquat 336 (Cognis), benzyldimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, and hexamethonium chloride. Other corrosion inhibitors include non-ionic surfactants such as PolyFox PF-159 (OMNOVA Solutions), poly(ethylene glycol) ("PEG"), poly(propylene glycol) ("PPG"), PEG-PPG copolymers such as Pluronic F-127 (BASF), anionic surfactants such as dodecylbenzenesulfonic acid, sodium dodecylbenzenesulfonate, and combinations thereof. The quaternary salts can function as both corrosion inhibitors (especially for copper and tungsten) and wetting agents. It will be obvious to those skilled in the art that, while quaternary salts are available commercially most often as chlorides or bromides, it is easy to ion-exchange the halide anion with non-halide anions such as sulfate, methanesulfonate, nitrate, hydroxide, etc. Such converted quaternary salts are also contemplated herein. In a particularly preferred embodiment, 5-methyl-1H-benzotriazole is known to block the oxidative activity of the oxidizing agents against copper. Alternatively, or in addition to the 5-methyl-1H-benzotriazole (mBTA), preferred corrosion inhibitors include pyrazole, benzotriazole, the cationic quaternary surfactant salts, more preferably myristyltrimethylammonium bromide, benzalkonium chloride, hexadecyltrimethylammonium p-toluenesulfonate, and hexadecyltrimethylammonium hydroxide, tetrazoles such as 5-benzyl-1H-tetrazole, and combinations thereof.

The semi-aqueous compositions described herein can optionally include at least one low-k passivating agent to reduce the chemical attack of the low-k dielectric layers and to protect the wafer from additional oxidation. Preferred low-k passivating agent include, but are not limited to, boric acid, borate salts, such as ammonium pentaborate, sodium tetraborate, 3-hydroxy-2-naphthoic acid, malonic acid, and iminodiacetic acid. When present, the semi-aqueous composition includes about 0.01 wt % to about 2 wt % low-k passivating agent, based on the total weight of the composition. Preferably, less than 2 wt. % of the underlying low-k material is etched/removed using the semi-aqueous compositions described herein, more preferably less than 1 wt. %, most preferably less than 0.5 wt. %, based on the total weight of the underlying low-k material.

To ensure wetting, especially when the pH is low, a surfactant can be added to the semi-aqueous composition, preferably an oxidation resistant, fluorinated anionic surfactant. Anionic surfactants contemplated in the compositions of the present invention include, but are not limited to, fluorosurfactants such as ZONYL® UR and ZONYL® FS-62 (DuPont Canada Inc., Mississauga, Ontario, Canada), and ammonium fluoroalkylsulfonates such as Novec™ 4300 (3M). When the etchant used comprises a fluoride, it is contemplated to use a long-chain tetraalkylammonium fluoride that can be used as a surfactant and the etchant.

The at least one organic solvent comprises at least one water-miscible organic solvent, wherein the at least one water-miscible organic solvent is selected from the group consisting of a compound of formula $R^1R^2R^3C(OH)$, where $R^1$, $R^2$ and $R^3$ are independent from each other and are selected from the group consisting of hydrogen, $C_2$-$C_{30}$alkyls, $C_2$-$C_{30}$alkenes, cycloalkyls, $C_2$-$C_{30}$alkoxys, and combinations thereof. For example, the at least one solvent can comprise at least one species selected from the group consisting of methanol, ethanol, isopropanol, butanol, pentanol, hexanol, 2-ethyl-1-hexanol, heptanol, octanol, ethylene glycol, 1,2- and 1,3-propylene glycol, 1,2-, 1,3-, and 1,4-butanediol, tetrahydrofurfuryl alcohol (THFA), butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, tetramethylene glycol dimethyl ether, dimethyl sulfoxide, and combinations thereof. Preferably, the at least one organic solvent comprises diethylene glycol monoethyl ether, diethylene glycol methyl ether, propylene glycol, ethylene glycol, tetraethylene glycol dimethyl ether, triethylene glycol methyl ether, triethylene glycol ethyl ether, tripropylene glycol monomethyl ether, dipropylene glycol monomethyl ether, or combinations thereof.

In another embodiment, any of the semi-aqueous compositions described herein may further comprise titanium nitride and/or photoresist etch material residue, wherein the residue is suspended and/or dissolved in the semi-aqueous composition.

In one embodiment, the composition of the first aspect comprises, consists of, or consists essentially of at least one oxidizing agent, at least one etchant, at least one corrosion inhibitor, at least source of silica, water, and at least one organic solvent, wherein the composition is substantially devoid of hydrogen peroxide, present in the following ranges, based on the total weight of the composition:

| component | % by weight | more preferred % by weight | most preferred % by weight |
| --- | --- | --- | --- |
| oxidizing agent(s) | about 0.0001 wt % to about 2 wt % | about 0.001 wt % to about 1 wt % | about 0.001 wt % to about 0.2 wt % |
| etchant(s) | about 0.01 wt % to about 10 wt % | about 0.01 wt % to about 5 wt % | about 0.1 wt % to about 2.5 wt % |
| corrosion inhibitor(s) | about 0.0001 wt % to about 10 wt % | about 0.0001 wt % to about 5 wt % | about 0.001 wt % to about 2 wt % |
| source(s) of silica | about 0.001 wt % to about 5 wt % | about 0.01 wt % to about 3 wt % | about 0.01 wt % to about 2 wt % |
| organic solvent(s/ | about 1 wt % to about 80 wt % | about 1 wt % to about 20 wt % | about 1 wt % to about 15 wt % |
| water | about 40 wt % to about 99.99 wt % | about 70 wt % to about 99 wt % | about 85 wt % to about 99 wt % |

In a particularly preferred embodiment of the semi-aqueous composition, the at least one oxidizing agent comprises vanadium oxide, ammonium vanadate, ammonium iodate, ammonium periodate, iodic acid, periodic acid, 1,4-benzoquinone, or combinations thereof the at least one etchant comprises hexafluorosilicic acid, tetrafluoroboric acid, or combinations thereof the at least one corrosion inhibitor comprises 5-methyl-1H-benzotriazole, pyrazole, benzotriazole, myristyltrimethylammonium bromide, benzalkonium chloride, hexadecyltrimethylammonium p-toluenesulfonate, hexadecyltrimethylammonium hydroxide, 5-benzyl-1H-tetrazole, or combinations thereof the at least one source of silica comprises TEOS, TMAS, sodium silicate, or combinations thereof, and the at least one organic solvent comprises diethylene glycol monoethyl ether, diethylene glycol methyl ether, propylene glycol, ethylene glycol, tetraethylene glycol dimethyl ether, triethylene glycol methyl ether, triethylene glycol ethyl ether, tripropylene glycol monomethyl ether, dipropylene glycol monomethyl ether, or combinations thereof.

It will be appreciated that it is common practice to make concentrated forms of the semi-aqueous composition to be diluted prior to use. For example, the composition may be manufactured in a more concentrated form and thereafter diluted with at least one solvent at the manufacturer, before use, and/or during use at the fab. Dilution ratios may be in a range from about 0.1 part diluent:1 part composition concentrate to about 100 parts diluent:1 part composition concentrate. It should further be appreciated that the compositions described herein include oxidizing agents, which can be unstable over time. Accordingly, the concentrated form can be substantially devoid of oxidizing agent(s) and the oxidizing agent can be introduced to the concentrate or the diluted semi-aqueous composition by the manufacturer before use and/or during use at the fab.

The semi-aqueous compositions described herein are easily formulated by simple addition of the respective ingredients and mixing to homogeneous condition. Furthermore, the semi-aqueous compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the semi-aqueous composition, i.e., more dilute or more concentrated, and it will be appreciated that the semi-aqueous compositions can variously and alternatively comprise, consist or consist essentially of any combination of ingredients consistent with the disclosure herein.

Accordingly, a second aspect relates to a kit including, in one or more containers, one or more components adapted to form the semi-aqueous compositions described herein. The containers of the kit must be suitable for storing and shipping said semi-aqueous composition components, for example, NOWPak® containers (Advanced Technology Materials, Inc., Danbury, Conn., USA). The one or more containers which contain the components of the composition preferably include means for bringing the components in said one or more containers in fluid communication for blending and dispense. For example, referring to the NOW-Pak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and PCT/US08/63276 entitled "SYSTEMS AND METHODS FOR MATERIAL BLENDING AND DISTRIBUTION" filed on May 9, 2008.

In a third aspect, the invention relates to methods of etching titanium nitride material from the surface of the microelectronic device having same thereon using the semi-aqueous composition described herein. For example, titanium nitride material may be removed without substantially damaging/removing metal conductor and insulator materials that are present on the microelectronic device. Accordingly, in a preferred embodiment, a method of selectively and substantially removing titanium nitride and/or photoresist etch residue materials relative to metal conductor and insulator materials from the surface of the microelectronic device having same thereon is described using the semi-aqueous composition described herein. In another preferred embodiment, a method of selectively and substantially removing titanium nitride and/or photoresist etch residue materials relative to metal conductor (e.g., copper), tungsten and insulator materials from the surface of the microelectronic device having same thereon is described using the semi-aqueous compositions described herein.

In etching applications, the composition is applied in any suitable manner to the surface of the microelectronic device having the titanium nitride and/or photoresist etch residue material thereon, e.g., by spraying the semi-aqueous composition on the surface of the device, by dipping (in a static or dynamic volume of the semi-aqueous composition) of the device including the titanium nitride and/or photoresist etch residue material, by contacting the device with another material, e.g., a pad, or fibrous sorbent applicator element, that has the semi-aqueous composition absorbed thereon, by contacting the device including the titanium nitride and/or photoresist etch residue material with a circulating semi-aqueous composition, or by any other suitable means, manner or technique, by which the semi-aqueous composition is brought into removal contact with the titanium nitride and/or photoresist etch residue material. The application may be in a batch or single wafer apparatus, for dynamic or static cleaning. Advantageously, the semi-aqueous compositions described herein, by virtue of their selectivity for titanium nitride and/or photoresist etch residue material relative to other materials that may be present on the microelectronic device structure and exposed to the composition, such as metals and insulating materials (i.e., low-k dielectrics), achieve at least partial removal of the titanium nitride and/or photoresist etch residue material in a highly efficient and highly selective manner.

In use of the semi-aqueous compositions described herein for removing titanium nitride and/or photoresist etch residue material from microelectronic device structures having same thereon, the semi-aqueous composition typically is contacted with the device structure in a single wafer tool for a sufficient time of from about 0.3 minute to about 30 minutes, preferably about 0.5 minutes to about 3 minutes, at temperature in a range of from about 20° C. to about 100° C., preferably about 45° C. to about 60° C. Such contacting times and temperatures are illustrative, and any other suitable time and temperature conditions may be employed that are efficacious to at least partially remove the titanium nitride and/or photoresist etch residue material from the device structure.

In one embodiment, the semi-aqueous composition is heated inline during delivery to the device structure. By heating inline, rather than in the bath itself, the semi-aqueous composition life increases.

Following the achievement of the desired etching action, the semi-aqueous composition can be readily removed from the microelectronic device to which it has previously been applied, e.g., by rinse, wash, or other removal step(s), as may be desired and efficacious in a given end use application of the semi-aqueous compositions described herein. For example, the device may be rinsed with a rinse solution including deionized water and/or dried (e.g., spin-dry, $N_2$, vapor-dry etc.).

The semi-aqueous compositions preferably selectively etch titanium nitride material relative to metal conductor and insulating (i.e., low-k dielectric) materials. In one embodiment, the etch rate of titanium nitride is high (upwards of 50 Å $min^{-1}$, preferably upwards of about 35 Å $min^{-1}$ at 50° C. and, while the etch rate of metal (e.g., Cu and W) is low (less about 10 Å $min^{-1}$, preferably less than about 5 Å $min^{-1}$) and the etch rate of low-k dielectric is low (less than about 10 Å $min^{-1}$, preferably less than about 5 Å $min^{-1}$) at the same temperature.

A fourth aspect relates to the improved microelectronic devices made according to the methods described herein and to products containing such microelectronic devices.

A fifth aspect relates to methods of manufacturing an article comprising a microelectronic device, said method comprising contacting the microelectronic device with a semi-aqueous composition for sufficient time to etchingly remove titanium nitride and/or photoresist etch residue material from the surface of the microelectronic device having same thereon, and incorporating said microelectronic device into said article, wherein the semi-aqueous composition comprises, consists of or consists essentially of at least one oxidizing agent, at least one etchant, at least one corrosion inhibitor, at least source of silica, water, and at least one organic solvent, wherein the composition is substantially devoid of hydrogen peroxide. The semi-aqueous composition may further comprise, consist of or consist essentially of titanium nitride material.

A sixth aspect of the invention relates to an article of manufacture comprising, consisting of or consisting essentially of a microelectronic device substrate, a titanium nitride layer on said substrate, and a composition described herein.

The features and advantages of the invention are more fully shown by the illustrative examples discussed below.

Example 1

A base solution 1 comprising 0.003 wt % periodic acid, 1.2 wt % $H_2SiF_6$, 0.004 wt % benzalkonium chloride, 0.3 wt % TEOS, and 98.493 wt % DI water was prepared. Starting with the base solution 1, formulations were prepared as shown in Tables 1-3 below. Copper, tungsten, TiN and PETEOS coupons were immersed in each formulation at 50° C. for time indicated and the etch rates determined.

TABLE 1

Formulations prepared by combining the indicated organic solvent with the balance base solution 1.

| | Organic Solvent | Cu E/R @ 20 min | W E/R @ 30 min | TiN E/R @ 1 min |
|---|---|---|---|---|
| Formulation A | N/A | 4.78 | 0.49 | 57.76 |
| Formulation B | 10 wt % TPGME | 5.00 | 1.42 | 57.05 |
| Formulation C | 10 wt % DPGME | 4.08 | 0.80 | 45.95 |
| Formulation D | 10 wt % Tetraethylene glycol dimethyl ether | 4.51 | 0.91 | 48.19 |
| Formulation E | 10 wt % Diethylene Glycol Monoethyl Ether | 6.18 | 1.16 | 45.38 |
| Formulation F | 10 wt % Triethylene Glycol Methyl Ether | 4.23 | 0.49 | 38.00 |
| Formulation G | 10 wt % Triethylene Glycol Ethyl Ether | 3.99 | 0.92 | 39.00 |
| Formulation H | 10 wt % Diethylene Glycol Methyl Ether | 3.67 | 0.73 | 39.72 |
| Formulation I | 10 wt % Ethylene glycol | 2.95 | 0.46 | 21.54 |
| Formulation J | 10 wt % Propylene gylcol | 3.26 | 0.91 | 37.56 |

TABLE 2

Formulations prepared by combining the indicated organic solvent and corrosion inhibitor with the balance base solution 1.

| | Organic Solvent | mBTA | Cu E/R @ 20 min | W E/R @ 30 min | TiN E/R @ 1 min |
|---|---|---|---|---|---|
| Formulation Z | N/A | 0.5 wt % | 5.74 | 0.83 | 51.62 |
| Formulation K | 10 wt % TPGME | 0.5 wt % | 7.06 | 0.59 | 37.27 |
| Formulation L | 10 wt % DPGME | 0.5 wt % | 2.16 | 0.97 | 44.01 |
| Formulation M | 10 wt % Tetraethylene glycol dimethyl ether | 0.5 wt % | 4.53 | 0.57 | 49.34 |
| Formulation N | 10 wt % Diethylene Glycol Monoethyl Ether | 0.5 wt % | 1.98 | 1.05 | 43.53 |
| Formulation O | 10 wt % Triethylene Glycol Methyl Ether | 0.5 wt % | 3.07 | 0.74 | 42.87 |
| Formulation P | 10 wt % Triethylene Glycol Ethyl Ether | 0.5 wt % | 3.07 | 0.80 | 42.02 |
| Formulation Q | 10 wt % Diethylene Glycol Methyl Ether | 0.5 wt % | 2.21 | 0.78 | 41.96 |
| Formulation R | 10 wt % Ethylene glycol | 0.5 wt % | 1.30 | 0.93 | 37.01 |
| Formulation S | 10 wt % Propylene gylcol | 0.5 wt % | 1.80 | 0.66 | 42.58 |

TABLE 3

Formulations prepared by combining the indicated organic solvent and corrosion inhibitor mBTA with the balance base solution 1.

| | mBTA (wt %) | Organic Solvent | Cu E/R @ 20 min | W E/R @ 30 min | TiN E/R @ 1 min | PETEOS E/R @ 30 min |
|---|---|---|---|---|---|---|
| Formulation Z | 0.500 | | 5.21 | 0.15 | 37.51 | −0.05 |
| Formulation K | 0.500 | 10 wt % TPGME | 7.06 | 0.59 | 37.27 | −0.56 |
| Formulation T | 0.500 | 50 wt % TPGME | 6.07 | 4.09 | 28.62 | 0.25 |
| Formulation U | 0.500 | 10 wt % diethylene glycol monobutyl ether | 6.98 | 4.22 | 38.87 | −0.12 |
| Formulation V | 0.500 | 50 wt % diethylene glycol monobutyl ether | 5.02 | 1.01 | 14.84 | 0.23 |
| Formulation L | 0.500 | 10 wt % DPGME | 1.60 | 0.47 | 42.47 | −0.13 |
| Formulation W | 0.500 | 50 wt % DPGME | 1.99 | −0.05 | 8.62 | 0.23 |
| Formulation X | 0.500 | 50 wt % Tetraethylene glycol dimethyl ether | 4.24 | 0.21 | 8.08 | 0.21 |
| Formulation Y | 0.500 | 50 wt % Triethylene Glycol Methyl Ether | 4.68 | 0.24 | 9.57 | 0.26 |

It can be seen that the addition of 10 wt % organic solvent and 0.5% mBTA had no significant effect on the TiN etch rate but did reduce the Cu and W etch rates. When the amount of organic solvent was raised to 50 wt %, the TiN etch rate decreased. The results with 50 wt % organic solvent suggest that the formulation can be tuned to alter the selectivity of the formulation. For example, by tuning the solvent concentration, the TiN etch rate can vary from 40 Å $min^{-1}$ to less than 10 Å $min^{-1}$, with reduced Cu and W etch rate, such as in Formulation L and W with solvent DPGME. In another aspect, the semi-aqueous composition is formulation to selectively remove copper relative to TiN and W or to selectively remove Cu and TiN relative to W.

It can be seen that the addition of 10 wt % organic solvent reduced the etch rate of copper, which is assumed to be because the organic solvent assisted with the dissolution of mBTA. Further, the addition of the organic solvents with mBTA had no negative effect on the TiN etch rate while still being compatible with Cu and W.

Example 2

A base solution 2 comprising 0.01 wt % ammonium vanadate, 1.2 wt % $H_2SiF_6$, 0.004 wt % myristyl trimethyl ammonium bromide, 0.3 wt % TEOS, and 98.486 wt % DI water was prepared. Starting with the base solution 2, formulations were prepared as shown in Table 4 below. Copper, tungsten, TiN, and PETEOS coupons were immersed in each formulation at 50° C. for time indicated and the etch rates determined

TABLE 4

Formulations prepared by combining the indicated organic solvent and corrosion inhibitor mBTA with the balance base solution 2.

| | mBTA (wt %) | Solvent | Cu E/R @ 20 min | W E/R @ 30 min | TiN E/R @ 1 min | PETEOS E/R @ 30 min |
|---|---|---|---|---|---|---|
| Formulation AA | 0.500 | N/A | 2.45 | <1 | 55.11 | <0.3 |
| Formulation BB | 0.500 | 10 wt % DPGME | 5.06 | <1 | 59.25 | <0.3 |
| Formulation CC | 0.500 | 10 wt % Tetraethylene glycol dimethyl ether | <2 | <1 | 58.08 | <0.3 |
| Formulation DD | 0.500 | 10 wt % diethylene glycol monoethyl ether | 3.24 | <1 | 57.85 | <0.3 |
| Formulation EE | 0.500 | 10 wt % Triethylene Glycol Methyl Ether | 2.90 | <1 | 61.28 | <0.3 |
| Formulation FF | 0.500 | 10 wt % THFA | <2 | <1 | 22.28 | <0.3 |
| Formulation GG | 0.500 | 10 wt % Triethylene Glycol Ethyl Ether | 2.44 | <1 | 63.66 | <0.3 |
| Formulation HH | 0.500 | 10 wt % diethylene glycol monomethyl ether | 4.25 | <1 | 59.20 | <0.3 |
| Formulation II | 0.500 | 10 wt % Ethylene glycol | 4.69 | <1 | 48.68 | <0.3 |
| Formulation JJ | 0.500 | 10 wt % Propylene gylcol | 8.36 | <1 | 51.00 | <0.3 |

It can be seen that only one solvent (THFA) significantly altered the etch rate of TiN at 10 wt %.

Example 3

Compositions comprising tetrafluoroboric acid, pyrazole, vanadium (IV,V) oxide, and water were prepared and the etch rates of coupons of PETEOS, Cu (Cu), TiN, and W were determined following immersion in each formulation at 50° C. The compositions and results are provided in Table 5.

TABLE 5

Formulations and Etch Rates

| Formulation | $HBF_4$/g | $V_6O_{13}$/g | pyrazole/g | DI $H_2O$/g | PETEOS ER/Å $min^{-1}$ | Cu ER/ Å $min^{-1}$ | TiN ER/ Å $min^{-1}$ | W ER/ Å $min^{-1}$ |
|---|---|---|---|---|---|---|---|---|
| KK | 0.1-0.5 | 0.001-0.2 | 0.1-0.4 | >95 | <0.3 | 29.07 | 15.79 | <2 |
| LL | 0.1-0.5 | 0.001-0.2 | 0.1-0.4 | >95 | <0.3 | 44.26 | 12.85 | 2-3 |
| MM | 0.1-0.5 | 0.001-0.2 | 0.4-0.8 | >95 | <0.3 | 45.72 | 9.87 | <2 |
| NN | 0.5-1 | 0.001-0.2 | 0.1-0.4 | >95 | 1.11 | 32.96 | >20 | 2-3 |
| OO | 0.5-1 | 0.001-0.2 | 0.1-0.4 | >95 | 1.62 | 35.28 | >20 | 2-3 |
| PP | 0.5-1 | 0.001-0.2 | 0.1-0.4 | >95 | 0.70 | 43.67 | >20 | >3 |
| QQ | 0.5-1 | 0.001-0.2 | 0.1-0.4 | >95 | 1.55 | 48.39 | 17.01 | <2 |
| RR | 0.5-1 | 0.001-0.2 | 0.4-0.8 | >95 | 0.47 | 48.76 | 17.85 | <2 |
| SS | 0.1-0.5 | 0.001-0.2 | 0.4-0.8 | >95 | <0.3 | 31.00 | 3.43 | <2 |

Example 4

Compositions comprising tetrafluoroboric acid, pyrazole, vanadium (IV,V) oxide, water, diethylene glycol monobutyl ether (DEGBE), and additional components were prepared as indicated in Table 6. The etch rates of coupons of PETEOS, Cu (Cu), TiN, and W were determined following immersion in each formulation at 40° C., as provided in Table 7.

TABLE 6

Formulations

| Formulation | HBF$_4$/g | V$_6$O$_{13}$/g | pyrazole/g | DI H$_2$O/g | DEGBE/g | Additional components |
|---|---|---|---|---|---|---|
| AAA | 0.1-0.5 | 0.002-0.2 | 0.4-0.8 | >80 | 15 | |
| BBB | 0.1-0.5 | 0.002-0.2 | 0.4-0.8 | >80 | 15 | 5 g DMSO |
| | | | | | | 1 g BTA |
| CCC | 0.1-0.5 | 0.002-0.2 | 0.4-0.8 | >80 | 15 | 5 g DMSO |
| | | | | | | 1 g BTA |
| | | | | | | 0.05 g oxalic acid |
| DDD | 0.5-1 | 0.002-0.2 | 0.4-0.8 | >80 | 15 | 5 g DMSO |
| | | | | | | 1 g BTA |
| | | | | | | 0.2 g oxalic acid |
| EEE | 0.5-1 | 0.002-0.2 | 0.4-0.8 | >80 | 15 | 5 g DMSO |
| | | | | | | 1 g BTA |
| | | | | | | 2 g acetic acid |
| FFF | 0.5-1 | 0.002-0.2 | 0.4-0.8 | >80 | 15 | 5 g DMSO |
| | | | | | | 1 g BTA |
| | | | | | | 0.2 g oxalic acid |

TABLE 7

Etch Rates of formulations AAA-FFF

| Formulation | PETEOS ER/Å min$^{-1}$ | Cu ER/ Å min$^{-1}$ | TiN ER/ Å min$^{-1}$ | W ER/ Å min$^{-1}$ |
|---|---|---|---|---|
| AAA | <0.3 | 19.534 | 7.286 | >3 |
| BBB | <0.3 | 7.860 | 4.447 | 2-3 |
| CCC | <0.3 | 3.235 | 2.790 | <2 |
| DDD | <0.3 | 3.613 | 1.323 | <2 |
| EEE | <0.3 | 7.017 | 4.869 | 2-3 |
| FFF | <0.3 | 3.262 | 1.495 | <2 |

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A semi-aqueous composition comprising:
    at least one oxidizing agent, wherein the oxidizing agent is present in amount ranging from 0.001 wt % to 0.2 wt % and comprises a species selected from the group consisting of periodic acid, iodic acid, vanadium (V) oxide, vanadium (IV,V) oxide, ammonium vanadate 1,4-benzoquinone, dimethyl-1,4-benzoquinone, and combinations thereof,
    from 0.1 wt % to 2.5 wt % of at least one etchant,
    from 0.001 wt % to about 2 wt % of at least one corrosion inhibitor selected from the group consisting of myristyltrimethylammonium bromide, benzalkonium chloride, hexadecyltrimethylammonium p-toluenesulfonate, hexadecyltrimethylammonium hydroxide, 5-benzyl-1H-tetrazole, and combinations thereof,
    from 0.01 wt % to 2 wt % of at least one source of silica selected from the group consisting of methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, ammonium hexafluororosilicate, sodium silicate, tetramethyl ammonium silicate (TMAS), and combinations thereof,
    from 85 wt % to 99 wt % water, and
    from 1 wt % to 15 wt % of at least one organic solvent; said composition substantially devoid of amines, chemical mechanical polishing abrasive materials, and hydrogen peroxide, the composition characterized by a TiN to tungsten selectivity of greater than 40:1 and a tungsten removal rate less than about 1 Å min$^{-1}$ when tungsten and TiN coupons are immersed in said composition at 50° C.

2. The composition of claim 1, wherein the etchant comprises a species selected from the group consisting of H$_2$ZrF$_6$, H$_2$TiF$_6$, HPF$_6$, HF, ammonium fluoride, ammonium bifluoride, tetrafluoroboric acid, hexafluorosilicic acid, tetrabutylammonium tetrafluoroborate (TBA-BF$_4$), ammonium hexafluorosilicate, ammonium hexafluorotitanate, tetraalkylammonium fluoride (NR$_1$R$_2$R$_3$R$_4$F), tetraalkylammonium hydroxide (NR$_1$R$_2$R$_3$R$_4$OH) where R$_1$, R$_2$, R$_3$, R$_4$ may be the same as or different from one another and is selected from the group consisting of straight-chained or branched C$_1$-C$_6$ alkyl groups, weak bases, and combinations thereof.

3. The composition of claim 1, wherein the etchant comprises tetrafluoroboric acid, hexafluorosilicic acid, HF, or combinations thereof.

4. The composition of claim 1, further comprising a source of silica, wherein the source of silica comprises at least one species selected from the group consisting of methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, ammonium hexafluororosilicate, tetramethyl ammonium silicate (TMAS), and combinations thereof.

5. The composition of claim 1, wherein the at least one organic solvent comprises a species selected from the group consisting of methanol, ethanol, isopropanol, butanol, pentanol, hexanol, 2-ethyl-1-hexanol, heptanol, octanol, ethylene glycol, 1,2- and 1,3-propylene glycol, 1,2-, 1,3-, and 1,4-butanediol, tetrahydrofurfuryl alcohol (THFA), butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME),dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, 2,3-dihydrodecafluoropentane, ethyl perfluorobutylether, methyl perfluorobutylether, alkyl carbonates, alkylene carbonates, 4-methyl-2-pentanol, tetramethylene glycol dimethyl ether, dimethyl sulfoxide, and combinations thereof.

6. The composition of claim 1, wherein the composition further comprises at least one low-k passivating agent selected from the group consisting of boric acid, ammonium pentaborate, sodium tetraborate, 3-hydroxy-2-napthoic acid, malonic acid, and iminodiacetic acid.

7. The composition of claim 1, wherein the composition is further substantially devoid of metal halides, and combinations thereof.

8. The composition of claim 1, wherein the composition has a TiN to tungsten selectivity of greater than 50:1 and a tungsten removal rate less than about 1 Å min$^{-1}$ and a TiN to copper selectivity of greater than 20:1 and a copper removal rate less than about 2 Å min$^{-1}$ at temperatures in a range from about 45° C. to about 60° C.

9. The composition of claim 1, wherein the pH of the composition is in a range from about 0 to about 4.

10. A semi-aqueous composition for selectively removing titanium nitride and/or photoresist etch residue material from the surface of a microelectronic device having same thereon, said composition comprising:
    at least one oxidizing agent present in amount ranging from 0.001 wt % to 0.2 wt % and selected from the group consisting of periodic acid, iodic acid, vanadium (V) oxide, vanadium (IV,V) oxide, ammonium vanadate, 1,4-benzoquinone, dimethyl-1,4-benzoquinone, and combinations thereof,
    from 0.1 wt % to 2.5 wt % of at least one etchant,
    from 0.001 wt % to 2 wt % of at least one corrosion inhibitor selected from the group consisting of myristyltrimethylammonium bromide, benzalkonium chloride, hexadecyltrimethylammonium p-toluenesulfonate, hexadecyltrimethylammonium hydroxide, 5-benzyl-1H-tetrazole, and combinations thereof,
    from 0.01 wt % to 2 wt % of at least one source of silica selected from the group consisting of methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, ammonium hexafluororosilicate, sodium silicate, tetramethyl ammonium silicate (TMAS), and combinations thereof,
    from 85 wt % to 95 wt % water, and
    from 1 wt % to 15 wt % of at least one organic solvent; wherein the composition is substantially devoid of hydrogen peroxide.

11. A method comprising contacting a surface of a microelectronic device comprising titanium nitride material, copper, tungsten, and low-k dielectric materials with a semi-aqueous composition, comprising:
    at least one oxidizing agent present in amount ranging from 0.001 wt % to 0.2 wt % and selected from the group consisting of periodic acid, iodic acid, vanadium (V) oxide, vanadium (IV,V) oxide, ammonium vanadate, 1,4-benzoquinone, dimethyl-1,4-benzoquinone, and combinations thereof;
    from 0.1 wt % to 2.5 wt % of at least one etchant;
    from 0.001 wt % to 2 wt % of at least one corrosion inhibitor selected from the group consisting of myristyltrimethylammonium bromide, benzalkonium chloride, hexadecyltrimethylammonium p-toluenesulfonate, hexadecyltrimethylammonium hydroxide, 5-benzyl-1H-tetrazole, and combinations thereof,
    from 0.01 wt % to 2 wt % of at least one source of silica selected from the group consisting of methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, ammonium hexafluororosilicate, sodium silicate, tetramethyl ammonium silicate (TMAS), and combinations thereof,
    from 85 wt % to 95 wt % water, and
    from 1 wt % to 15 wt % of at least one organic solvent; said composition substantially devoid of amines, chemical mechanical polishing abrasive materials, and hydrogen peroxide, the composition characterized by a TiN to tungsten selectivity of greater than 40:1 and a tungsten removal rate less than about 1 Å min$^{-1}$ when tungsten and TiN coupons are immersed in said composition at 50° C.

12. The method of claim 11, wherein the contacting comprises time in a range from about 0.3 minute to about 30 minutes at temperature in a range of from about 20° C. to about 100° C.

13. The method of claim 11, wherein the composition is rinsed from the surface following the desired etching action.

14. The method of claim 11, wherein the composition has a TiN to tungsten selectivity of greater than 40:1 and a tungsten removal rate less than about 1 Å min$^{-1}$ and a TiN to copper selectivity of greater than 20:1 and a copper removal rate less than about 2 Å min$^{-1}$ at temperatures in a range from about 45° C. to about 60° C.

* * * * *